US006801467B2

(12) United States Patent
Ferrant et al.

(10) Patent No.: US 6,801,467 B2
(45) Date of Patent: Oct. 5, 2004

(54) DRAM CELL REFRESHMENT METHOD AND CIRCUIT

(75) Inventors: Richard Ferrant, Saint Ismier (FR); Florent Vautrin, Vizille (FR)

(73) Assignee: STMicroelectronics S.A., Montrouge (FR)

( * ) Notice: Subject to any disclaimer, the term of this patent is extended or adjusted under 35 U.S.C. 154(b) by 40 days.

(21) Appl. No.: 10/186,289

(22) Filed: Jun. 27, 2002

(65) Prior Publication Data

US 2003/0022427 A1 Jan. 30, 2003

(30) Foreign Application Priority Data

Jun. 27, 2001 (FR) .......................................... 01 08455

(51) Int. Cl.[7] .................................................. G11C 7/00
(52) U.S. Cl. ...................................... 365/222; 365/149
(58) Field of Search ................................ 365/222, 149

(56) References Cited

U.S. PATENT DOCUMENTS

| 4,769,792 | A | | 9/1988 | Nogami et al. ............. 365/222 |
| 4,805,152 | A | | 2/1989 | Kogan ........................ 365/222 |
| 5,262,982 | A | * | 11/1993 | Brassington et al. ....... 365/145 |
| 6,515,930 | B2 | * | 2/2003 | Jacquet et al. .............. 365/222 |

* cited by examiner

Primary Examiner—M. Tran
(74) Attorney, Agent, or Firm—Lisa K. Jorgenson; Robert Iannucci; Seed IP Law Group PLLC

(57) ABSTRACT

A device and a method for refreshing the voltage of a circuit line that provides the capability of bringing the circuit line to a ground voltage or to a first voltage. The method provides storing the circuit line voltage in a capacitor; and controlling, by means of the stored voltage, a switch connecting the circuit line to a second voltage of absolute value greater than the first voltage, whereby the circuit line is set to the second voltage if, during the step of storing, the circuit line was at the first voltage.

16 Claims, 4 Drawing Sheets

DRAM CELL REFRESHMENT METHOD AND CIRCUIT

BACKGROUND OF THE INVENTION

1. Field of the Invention

The present invention relates to DRAMs, and more specifically to a method and a device enabling increasing the refreshment voltage of the cells in a DRAM.

2. Discussion of the Related Art

A DRAM includes memory cells in which a logic information "1" or "0" can be stored. Each memory cell includes a capacitor in which a predetermined voltage chosen from among two values is stored according to whether a 1 or a 0 is memorized in the cell. The capacitor of a memory cell can never be perfectly isolated, and the voltage on the capacitor is not steady and declines along time. After a predetermined duration, called the retention period, the voltage stored in the capacitor of a memory cell may thus be too small to be readable. To avoid loss of the information stored in each capacitor, the voltage stored in each capacitor is periodically refreshed. For this purpose, a read device periodically compares the voltage stored in each capacitor with a reference voltage, after which it charges each capacitor to one or the other of the predetermined voltages according to whether the compared voltage is greater or smaller than the reference voltage.

FIG. 1 schematically shows a conventional DRAM structure arranged in rows and columns. A single memory cell Mi of the memory is shown. Memory cell Mi includes a capacitor Ci having a first terminal connected to a reference voltage Vp. A second terminal of capacitor Ci is connected to a bit line BL via a switch Si. The second terminal of capacitor Ci forms an input/output terminal of memory cell Mi. The control terminal of switch Si forms a terminal of selection of memory cell Mi, and receives a selection signal WLi. Bit line BL is connected to an input terminal of a read device 2 via a switch 4. Device 2 includes two identical inverters 6 and 8 assembled in antiparallel. Input I6 of inverter 6, connected to the output of inverter 8, forms the input terminal of device 2. The output of inverter 6 is connected to input I8 of inverter 8. A high supply terminal of inverters 6 and 8 is connected to a positive supply voltage Vdd via a switch 10. Switch 10 receives a control signal RESTORE. A low supply terminal of inverters 6 and 8 is connected to a ground voltage GND via a switch 12. Switch 12 receives a control signal SENSE. The input of inverter 8 is connected to a reference bit line BLref via a switch 14. Switches 4 and 14 receive a same control signal PASS. Reference bit line BLref is provided to exhibit a stray capacitance identical to that of bit line BL. A reference memory cell Mref, having a structure identical to that of memory cell M, is connected to reference bit line BLref. Cell Mref includes a capacitor Cref connected to bit line BLref via a switch Sref. Capacitor Cref is identical to capacitor Ci. The terminal of selection of memory cell Mref receives a control signal WLref. A precharge circuit 16, controlled by a signal PRA, is connected to terminals I6 and I8. Precharge circuits, not shown, controlled by signal PRA, are connected to lines BL and BLref and to the input/output terminal of memory cell Mref. Control signals WLi, WLref, PASS, RESTORE, and PRA are generated by control means not shown.

Bit lines BL and BLref are connected to a refreshment device 18. Device 18 includes P-channel MOS transistors 20 and 22, having their respective drains connected to lines BL and BLref. The sources of transistors 20 and 22 are interconnected. The gate of transistor 20 is connected to the drain of transistor 22 and the gate of transistor 22 is connected to the drain of transistor 20. A P-channel transistor 24 has its source connected to a supply voltage Vcc greater than voltage Vdd and its drain connected to the sources of transistors 20 and 22. The gate of transistor 24 receives a control signal noBOOST.

FIGS. 2A through 2H illustrates the variation along time of the voltages of bit lines BL and BLref, and of signals WLi, WLref, SENSE, RESTORE, PASS, noBOOST, and PRA in a step of refreshment of memory cell Mi. At an initial time t0, signals WLi and WLref are at 0 and capacitors Ci and Cref of memory cells Mi and Mref are isolated from lines BL and BLref. Signal PASS is at 0 and terminals I6 and I8 are isolated from lines BL and BLref. Signals SENSE and RESTORE are at 0 and inverters 6 and 8 are deactivated. Signal PRA is at 1 and block 16 forces the voltages of terminals I6 and I8 to a voltage Vdd/2. Similarly, precharge circuits, not shown, force bit lines BL and BLref to voltage Vdd/2, and the input/output terminal of cell Mref to a reference voltage which is considered, for simplification, to be equal to Vdd/2.

At a time t1, signal PRA is brought to 0. The precharge circuits are then deactivated.

At a time t2, signals WLi, WLref, and PASS are brought to 1. Capacitors Ci and Cref are then respectively connected to terminals I6 and I8. Bit line BL and terminal I6 each exhibit a mainly capacitive predetermined impedance. From time t2, the charges stored in capacitor Ci distribute between capacitor Ci and the stray capacitances of line BL, of terminal I6, and of the gate of transistor 22. FIG. 2 illustrates an example in which a voltage Vdd/2+ΔV is stored in capacitor Ci at a time t2. After time t2, the charges stored in capacitor Ci distribute between capacitor Ci and the stray capacitances of bit line BL, of terminal I6, and of the gate of transistor 22. Because of the charge transferred to the stray capacitances, the terminal I6 is thus brought to a voltage Vdd/2+δV smaller than voltage Vdd/2+ΔV. Terminal I8, connected to line BLref and to capacitor Cref, remains at voltage Vdd/2.

At a time t3, signal SENSE is brought to 1 to turn switch 12 on. The low supply terminals of inverters 6 and 8 are then connected to voltage GND. As a response to voltage Vdd/2+δV of terminal I6, inverter 6 forces terminal I8 and line BLref to voltage GND.

At a time t4, signal RESTORE is brought to 1 to turn switch 10 on. Inverters 6 and 8 are then supplied by voltage Vdd, and inverter 8 forces terminal I6 and line BL to voltage Vdd. Memory cell Mi is then recharged to voltage Vdd. Technological progress and the increase in memory circuit integration especially causes a reduction in the size of the transistors (not shown) forming inverters 6 and 8, and a decrease in supply voltage Vdd of these transistors. Now, a memory cell refreshed with too small a voltage Vdd is rapidly discharged, that is, it soon becomes unable to provide a sufficient voltage Vdd/2+ΔV to control inverter 6 at time t3. Device 18 is provided to pull up the refreshment voltage of memory cell Mi.

At a time t5, signal noBOOST is brought to 0 to turn switch 24 on. Their transistors 20 and 22 must be matched so that their characteristics are identical and remain so, for example, in case of a variation in the operating temperature. In the example shown, the gate-source voltage of transistor 20 is more negative than the gate-source voltage of transistor 22 and transistor 20 becomes more conductive than transistor 22. As a result, from time t5, line BL is quickly brought to voltage Vcc, which results in turning transistor 22 off. Line BLref thus remains at voltage GND. Memory cell Mi is then recharged to voltage Vcc, and the refreshment operation is over.

At a time t6, signal noBOOST is brought to 1 to make transistor 24 non-conductive and deactivate device 18. At time t6, signal PASS is brought to 0, to turn off switches 4 and 14 and to isolate terminals I6 and I8 from lines BL and BLref, respectively. At time t6, signals SENSE and RESTORE are brought to 0 to turn off switches 10 and 12 and to deactivate inverters 6 and 8. At time t6, signals WLi and WLref are brought to 0 to isolate capacitors Ci and Cref from lines BL and BLref.

At a time t7, precharge signal PRA is brought to 1 to control the precharge of terminals I6 and I8, of lines BL and BLref, and of capacitor Cref, to prepare a next refreshment operation.

In the illustrated example, memory cell Mi stores before time t2 a voltage Vdd/2+ΔV (logic "1") greater than voltage Vdd/2 stored in reference memory cell Mref. In the case where memory cell Mi stores a voltage (logic "0") smaller than the voltage stored in cell Mref, device 2 brings line BL to voltage GND at time t3 and line BLref to voltage Vdd at time t4. At time t5, device 18 then brings bit line BLref to voltage Vcc and maintains line BL at voltage GND.

A read operation on memory cells Mi includes the refreshment operation just described. The result of the read operation is for example indicated by the state of terminal I6 at time t5. For a write operation on cell Mi, a means not shown forces the state of terminal I6 before activating device 18, whatever the voltage stored in capacitor Ci.

Matched transistors 20 and 22 must have a large gate length to be able to undergo high voltages, and a large gate width, to be able to rapidly switch when switched, at time t6. The gate connections of transistors 20 and 22 must have the same lengths for transistors 20 and 22 to switch under the same conditions. In practice, the implantation of matched transistors 20 and 22 is particularly difficult and a significant surface area is reserved in the extension of each pair of memory cell columns to adequately arrange these transistors. A mismatching is likely to cause a switching failure and a read error.

Further, voltage Vdd/2+δV provided to inverter 6 from voltage Vdd/2+ΔV stored in the memory cell is all the smaller as the gate capacitance of transistor 22 is strong.

BRIEF SUMMARY OF THE INVENTION

An embodiment of the present invention provides a device for refreshing bit lines of a DRAM, which enables faultless refreshment, without requiring the presence of two perfectly matched transistors.

An embodiment of the present invention provides a method for refreshing the voltage of a circuit line capable of being brought to a ground voltage or to a first voltage, including the successive steps of:

storing a line voltage in a capacitor; and controlling, by means of the stored voltage, a switch connecting the line to a second voltage of absolute value greater than the first voltage, whereby the line is set to the second voltage if, during the step of storing, the line was at the first voltage.

According to an embodiment of the present invention, the circuit is a DRAM, the line being connected to at least one memory cell of the DRAM, and being likely to be brought to the ground voltage or to the first voltage by a read device of the memory cell.

An embodiment of the present invention is also directed at a circuit for refreshing the voltage of a circuit line initially brought to a ground voltage or to a first voltage, including:

a first switch connecting the line to a second voltage having an absolute value greater than the first voltage;

a capacitor having a first terminal connected to the control terminal of the first switch;

a second switch connecting the line to the first terminal of the capacitor;

a third switch connecting a second terminal of the capacitor to the line;

a fourth switch connecting the second terminal of the capacitor to the ground voltage; and a control means for, first, turning on the second and fourth switches and turning off the third switch and, second, turning on the third switch and turning off the second and fourth switches.

According to an embodiment of the present invention, the first switch is a first N-channel MOS transistor having its drain and its source respectively connected to the second voltage and to the line, and having its gate connected to the first terminal of the capacitor;

the second switch is a second N-channel MOS transistor having its drain connected to the first terminal of the capacitor and having its source connected to the line;

the third switch is a third N-channel MOS transistor having its drain connected to the second terminal of the capacitor and having its source connected to the line.

According to an embodiment of the present invention, the fourth switch includes a fourth N-channel MOS transistor having its drain connected to the second terminal of the capacitor and having its source connected to the ground voltage.

According to an embodiment of the present invention, the line is connected to a plurality of memory cells of the DRAM, and is likely to be brought to the ground voltage or to the first voltage by a device for reading from the memory cell.

The foregoing features and advantages of the present invention, will be discussed in detail in the following non-limiting description of specific embodiments in connection with the accompanying drawings.

DETAILED DESCRIPTION OF THE INVENTION

Figure 1:
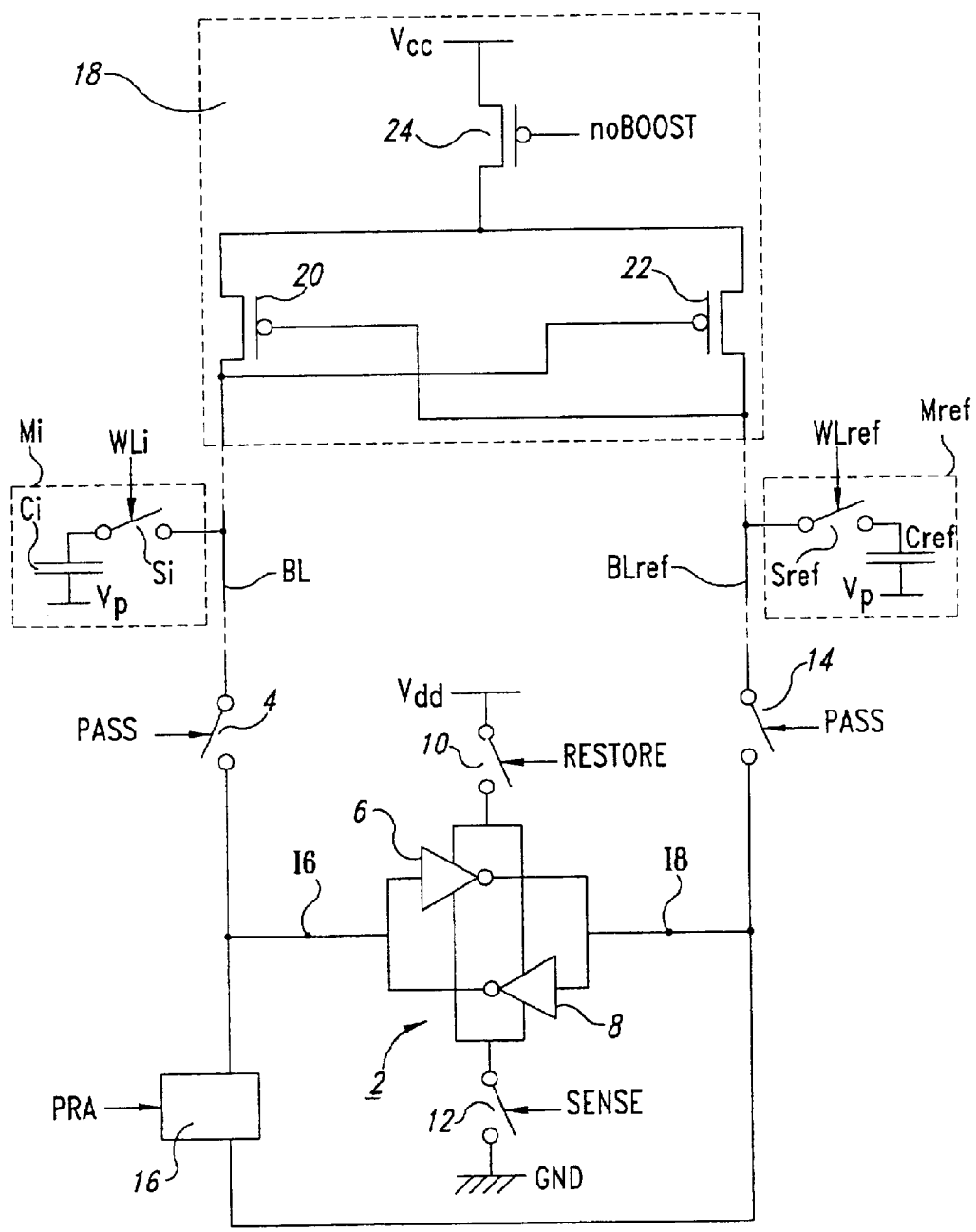
FIG. 1, previously described, schematically shows a device for reading from a DRAM, provided with a conventional refreshment means.
Figure 2:
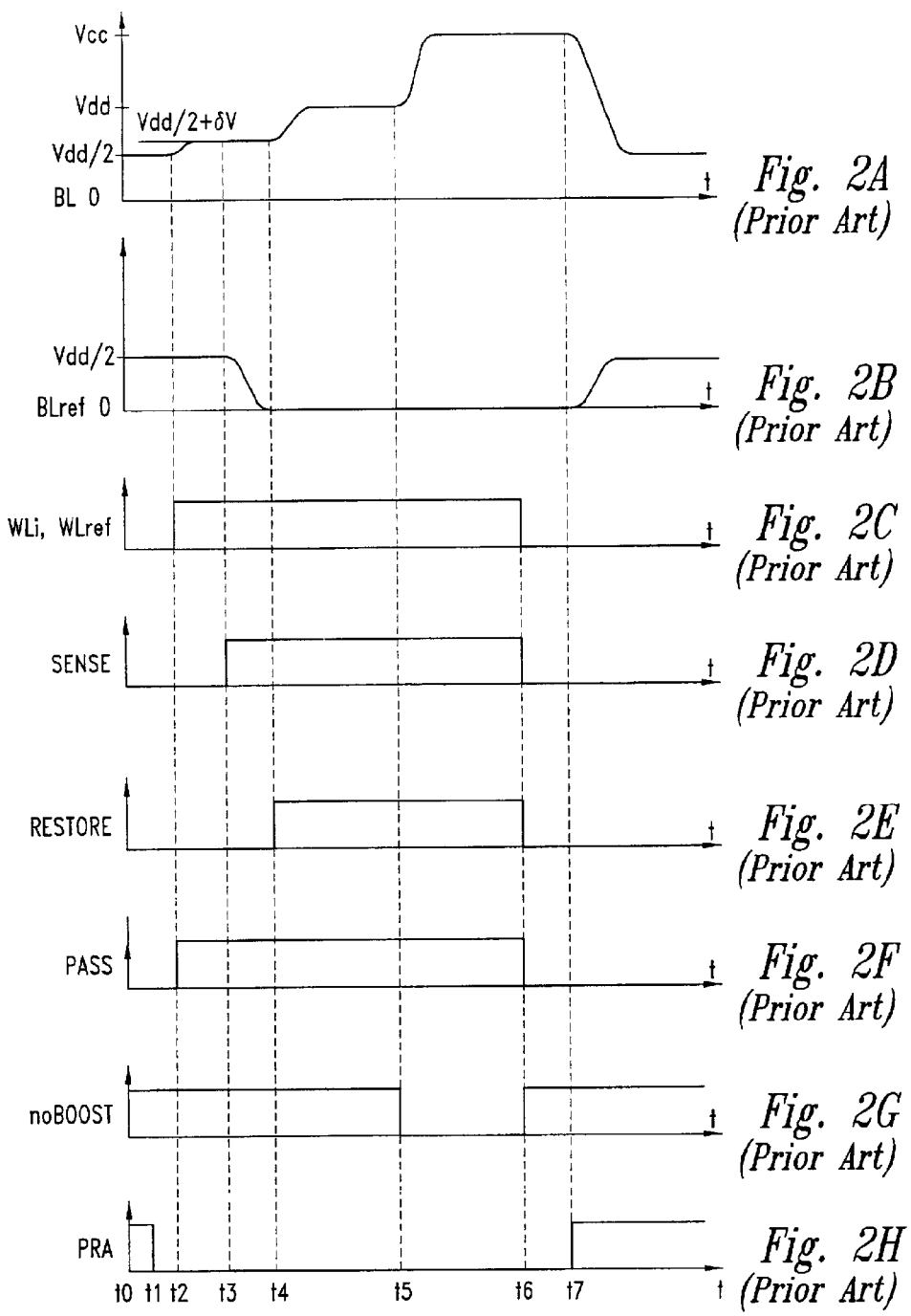
FIGS. 2A through 2H, previously described, illustrates the operation of the device of FIG. 1.

An embodiment of the present invention provides a refreshment device including two distinct refreshment circuits respectively connected to the bit line and to the reference bit line. The refreshment circuits operate independently from each other and they can be implanted at any location of the circuit. The same reference numbers and labels designate the same elements in FIGS. 1 and 3. Only those elements necessary to the understanding of the present invention have been shown.

Figure 3:
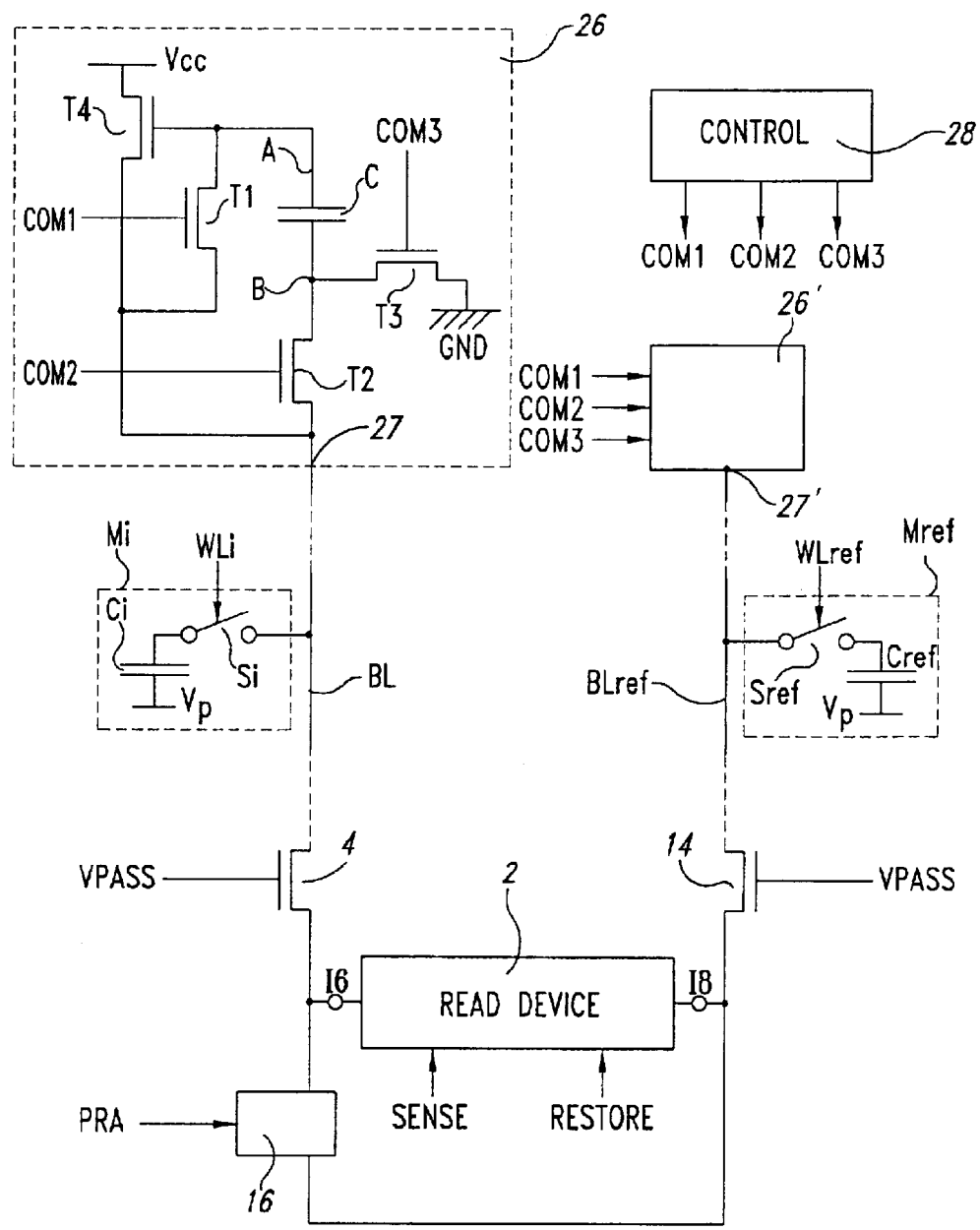
FIG. 3 schematically shows a device for reading from a DRAM provided with a refreshment device according to the present invention.

FIG. 3 schematically shows a read device 2 connected to a memory cell Mi of a DRAM by a switch 4 and by a bit line BL. A refreshment circuit 26 according to the present invention is connected to bit line BL by a terminal 27. Device 2 is also connected to a reference memory cell Mref by a switch 14 and a bit line BLref, a refreshment circuit 26' identical to circuit 26 being connected to line BLref by a terminal 27'. In the example shown, switches 4 and 14 are N-channel transistors having their gates maintained at a predetermined voltage $V_{PASS}$ which will be described hereafter. Device 26 includes a capacitor C having a first terminal A connected to the drain of an N-channel transistor T1. The source of transistor T1 is connected to terminal 27. A second terminal B of capacitor C is connected to the drain of a second N-channel transistor T2. The source of transistor T2 is connected to terminal 27. Terminal B is also connected to the drain of an N-channel transistor T3. The source of transistor T3 is connected to ground voltage GND. An N-channel transistor T4 has its source connected to terminal 27 and its drain connected to voltage Vcc. The gate of transistor T4 is connected to terminal A. The gates of transistors T1, T2, T3 respectively receive control signals COM1, COM2, and COM3 generated by a control means 28. The structure of means 28, within the abilities of those skilled in the art, is not detailed.

FIGS. 4A through 4F illustrate the variation along time of the voltages of bit lines BL and BLref, of terminals A and B and of control signals COM1, COM2, COM3, PRA, WLi, and WLref upon refreshment of memory cell Mi by read device 2 and refreshment circuit 26. Control signals SENSE and RESTORE of read device 2 have not been shown. The time scale is given as an indication only. In practice, the illustrated signals may have an aspect different from the curves of FIGS. 4A to 4F.

Figure 4A:
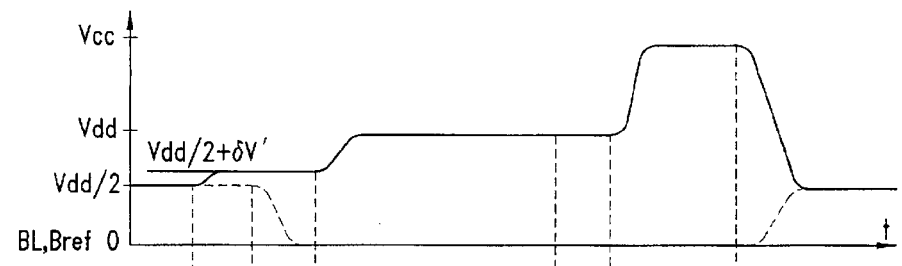
FIGS. 4A through 4F illustrates the operation of the device of FIG. 3.
Figure 4B:
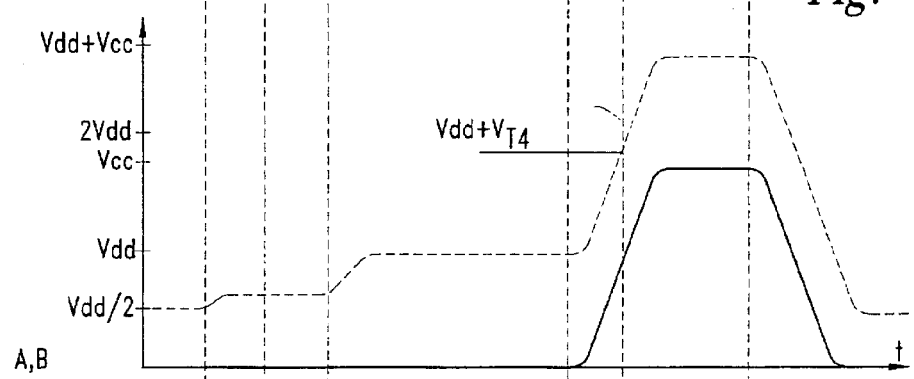
Figure 4C:
Figure 4D:
Figure 4E:
Figure 4F:

At a time t0, before the beginning of the refreshment, signal COM2 is at 0 and transistor T2 is non-conductive, FIG. 4D. Signals COM1 and COM3 are at 1 and transistors T1 and T3 are conductive, FIG. 4C. Terminal A is connected to bit line BL and terminal B is connected to ground GND. The gate and the source of transistor T4 are short-circuited. Signal PRA of FIG. 4E is at 1 so that precharge circuit 16 as well as precharge circuits not shown force terminals I6 and I8, and bit lines BL and BLref to voltage Vdd/2 as shown in FIG. 4A. Signal PRA also controls a precharge circuit not shown to force capacitor Cref of reference memory cell Mref to voltage Vdd/2. Signals WLi and WLref are at 0 as shown in FIG. 4F, so that switches Si and Sref are off and that capacitors Ci and Cref are isolated from bit lines BL and BLref. Voltage $V_{PASS}$ is chosen so that transistors 4 and 14 are on as long as their drain voltage does not exceed a predetermined threshold, to avoid a voltage rejection from terminals 27, 27' to read device 2. In the illustrated example, $V_{PASS}$ can be substantially equal to Vdd increased by the threshold voltage of transistors 4 or 14.

At successive times t1, t2, t3, and t4, signals PRA, WLi, and WLref, as well as signals SENSE and RESTORE (not shown) for controlling the read device 2 are controlled to stop the precharge, compare the voltage stored in cell Mi to the voltage stored in cell Mref, then bring line BL to voltage Vdd or to voltage GND according to whether cell Mi contains a voltage greater or smaller than the voltage stored in cell Mref. In the illustrated example, line BL is brought to voltage Vdd.

At a time t5', signals COM1 and COM3 of FIG. 4C are brought to 0 to turn off switches T1 and T3. Capacitor C remains charged and memorizes the voltage of line BL (Vdd in the illustrated example).

At a time t6', signal COM2 of FIG. 4D is brought to 1 to turn on transistor T2. The voltage across capacitor C is thus applied between the gate and the source of transistor T4. If the voltage across capacitor C is equal to 0, transistor T4 remains off and line BL remains at voltage GND. If the voltage across capacitor C is substantially equal to Vdd (as in the illustrated example), the voltage of terminals B and A respectively increase towards voltages Vdd and 2 Vdd. Transistor T4 is turned on at a time t7', when the gate/source voltage of transistor T4 exceeds its threshold voltage $V_{T4}$. Bit line BL and terminal B are then brought to voltage Vcc. The memory cell is then recharged to voltage Vcc, and the refreshment operation is over.

At a time t8', signals WLi and WLref of FIG. 4F are controlled to isolate capacitors Ci and Cref.

At a time t9', signal COM2 is brought to 0 to turn off transistor T2.

At a time t10', signal PRA is controlled to activate the precharge and signals COM1 and COM3 are brought to 1 to turn on T1 and T3.

A read operation on the memory cell is identical to the refreshment operation just described. A write operation on cell Mi is performed conventionally by forcing the voltage of terminal I6 to bring the bit line to voltage Vdd, then by activating refreshment device 26.

An advantage of the present invention is that circuits 26 and 26' operate independently from each other, and that they can accordingly be implanted independently in the memory circuit. Especially, circuits 26 and 26' may be arranged in spaces left free by the implantation of other elements of the memory circuit. This enables forming a memory circuit substantially smaller than a memory circuit using conventional refreshment devices such as circuit 18 of FIG. 1, although the sum of the sizes of circuits 26 and 26' are of the same order as the size of circuit 18.

Further, circuit 26 of FIG. 3 introduces substantially no stray capacitance on line BL, which eases the reading of the voltage stored in memory cell Mi and is an additional advantage of the present invention.

It has been considered, up to now, that bit line BL is connected to a column of memory cells Mi and that reference bit line BLref is connected to a reference memory cell Mref. In practice, bit lines BL and BLref are identical. Bit line BL is connected to a reference memory cell Mref' and bit line BLref is connected to a memory cell column Mi'. Upon refreshment or reading of a memory cell Mi connected to bit line BL, memory cell Mref connected to bit line BLref is activated, as described previously, and circuit 26 refreshes cell Mi. Upon refreshment or reading of a memory cell Mi' connected to bit line BLref, reference memory cell Mref' connected to bit line BL is activated, and circuit 26' refreshes cell Mi'.

The present invention has been described with a single pair of bit lines BL, BLref and a single pair of refreshment circuits 26, 26'. However, in practice, a memory circuit will include a large number of pairs of bit lines and of pairs of refreshment circuits.

The present invention has been described in a case where a single pair of bit lines BL, BLref is connected to a read device 2. However, in practice, several pairs of bit lines may be selectively connected to a same read device 2 by an appropriate control of switches 4 and 14 associated with each bit line pair.

For simplicity, the present invention has been described without taking into account the voltage drops introduced by transistors T1 and T2 and switch 4 when on. In practice, transistors T1 and T2 and switch 4 introduce voltage drops substantially equal to their threshold voltages.

Of course, the present invention is likely to have various alterations, modifications, and improvements which will readily occur to those skilled in the art. For example, the present invention has been described in relation with positive voltages Vdd and Vcc, but those skilled in the art will easily adapt the present invention to negative voltages, especially by replacing the described N-channel MOS transistors with P-channel MOS transistors. In such a case, it is possible to precharge bit lines BL and BLref to voltage GND between two refreshment operations. It is then possible for circuit 26 to include no transistor T3 in charge of bringing terminal B to voltage GND, if transistor T2 is turned on during this precharge.

The present invention has been described in relation with, before each refreshment or read operation, a precharge of the input/output terminal of reference memory cell Mref to a voltage Vdd/2. In practice, the input/output terminal of the reference memory cell will be precharged to a predetermined voltage depending on the memory circuit. For example, this predetermined voltage may be substantially equal to half of voltage Vdd/2+ΔV stored in the memory cells memorizing a "1" upon their reading before refreshment.

The operation of the refreshment circuit according to the present invention has been described in relation with a specific sequencing of the control signals shown in FIGS. 4C through 4F, but those skilled in the art will easily adapt the present invention to any other sequencing of the control signals enabling similar operation of the refreshment circuit.

The present invention has been described in the context of a use in a DRAM circuit, but those skilled in the art will readily adapt the present invention to a use in any circuit requiring devices for pulling up a low voltage to a higher voltage, especially analog-to-digital and digital-to-analog conversion circuits.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for refreshing the voltage of a circuit line able to be brought to a ground voltage or to a first voltage, comprising the successive steps of:
   connecting the terminals of a capacitor respectively to the ground voltage and to the circuit line, in order to store the line voltage in the capacitor; and
   modifying the connections of the terminals of the capacitor in order to apply the voltage stored in the capacitor between the circuit line and a control terminal of a switch connecting the line to a second voltage of absolute value greater than the first voltage, whereby the line is set to the second voltage if, during the step of storing, the line was at the first voltage.

2. The method of claim 1, wherein the circuit is a DRAM, the line being connected to at least one memory cell of the DRAM, and being able to e brought to the ground voltage or to the first voltage by a read device of the memory cell.

3. A circuit for refreshing the voltage of a circuit line initially brought to a ground voltage or to a first voltage, comprising:
   a first switch connecting the line to a second voltage having an absolute value greater than the first voltage;
   a capacitor having a first terminal connected to the control terminal of the first switch;
   a second switch connecting the line to the first terminal of the capacitor;
   a third switch connecting a second terminal of the capacitor to the line;
   a fourth switch connecting the second terminal of the capacitor to the ground voltage; and
   a control means for, first, turning on the second and fourth switches and turning off the third switch and, second, turning on the third switch and turning off the second and fourth switches.

4. The refreshment circuit of claim 3, wherein:
   the first switch is a first N-channel MOS transistor having its drain and its source respectively connected to the second voltage and to the line, and having its gate connected to the first terminal of the capacitor;
   the second switch is a second N-channel MOS transistor having its drain connected to the first terminal of the capacitor and having its source connected to the line; and
   the third switch is a third N-channel MOS transistor having its drain connected to the second terminal of the capacitor and having its source connected to the line.

5. The refreshment circuit of claim 4, wherein the fourth switch includes a fourth N-channel MOS transistor having its drain connected to the second terminal of the capacitor and having its source connected to the ground voltage.

6. A DRAM circuit including the refreshment circuit of claim 3, wherein the line is connected to a plurality of memory cells of the DRAM, and is able to be brought to the ground voltage or to the first voltage by a device for reading from the memory cell.

7. A refresh device for restoring a voltage to a status line of a memory cell, comprising:
   a charge storage device having first and second terminals;
   a first switching circuit structured to provide charge transfer between the status line and the charge storage device; and
   a second switching circuit, controlled by said charge storage device, to connect the status line to a refresh voltage if the status line was at first logic level during the charge transfer.

8. The refresh device according to claim 7 wherein the memory cell further comprises an isolation switch having control, first and second terminals wherein the first terminal of the isolation switch is coupled to the memory cell, and the second terminal of the isolation switch is coupled to the status line.

9. The refresh device according to claim 7 wherein the first switching circuit comprises:
   a first switching device having a control input coupled to a first control output of a timing device for coupling the first terminal of the charge storage device to the status line; and
   a second switching device having a control input coupled to a second control output of the timing device for coupling the second terminal of the charge storage device to a voltage reference; wherein the second switching circuit includes:

a third switching device having a control input coupled to a third control signal of the timing device for coupling the second terminal of the charge storage device to the status line; and a fourth switching device having a control input coupled to the first terminal of the charge storage device and conduction terminals connected between the refresh voltage and the status line.

10. The refresh device according to claim 7 wherein the first switching device comprises:

a first switch having first and second terminals and a control terminal wherein the first terminal is coupled to the first terminal of the charge storage device, the second terminal is coupled to the status line, and the control terminal is coupled to a first control output of a timing device thereby electrically isolating or alternatively, coupling the first terminal of the charge storage device to the status line; and a second switch having first and second terminals and a control terminal wherein the first terminal is coupled to the second terminal of the charge storage device, the second terminal is coupled to a voltage reference, and the control terminal is coupled a second control output of the timing device thereby electrically isolating or alternatively, coupling the voltage reference to the second terminal of the charge storage device; wherein the second switching circuit includes:

a third switch having first and second terminals and a control terminal wherein the first terminal is coupled to the second terminal of the charge storage device, the second terminal is coupled to the status line, and the control terminal is coupled to a third control output of the timing device thereby electrically isolating or alternatively, coupling the second terminal of the charge storage device to the status line; and a fourth switch having first and second terminals and a control terminal wherein the first terminal is coupled to the refresh voltage, the second terminal is coupled to the status line, and the control terminal is coupled the first terminal of the charge storage device thereby providing additional charge to the status line.

11. The refresh device according to claim 10 wherein the first, second, third and fourth switching devices comprise NMOS transistors, each transistor being independently positioned on a substrate with respect to each other and the memory cell.

12. The refresh device according to claim 7 wherein the first switching circuit comprises:

a first switching device having a control input coupled to a first control output at a timing device for coupling the first terminal of the charge storage device to the status line; and a second switching device having a control input coupled to a second control output of the timing device for coupling the second terminal of the charge storage device to a voltage reference.

13. The refresh device according to claim 7 wherein the second switching circuit includes:

a first switching device having a control input coupled to a control signal of a timing device for coupling the second terminal of the charge storage device to the status line; and a second switching device having a control input coupled to the first terminal of the charge storage device and conduction terminals connected between the refresh voltage and the status line.

14. A method of operation for refreshing a charge of a memory cell having a logic state of a DRAM array having a first, second and third supplies comprising the steps of:

setting a first initial charge on a status line having a first initial voltage, a second initial charge on a charge storage device having a second initial voltage, and a reference charge on a reference line;

sharing a portion of the charge of the memory cell between the status line and the charge storage device whereby the portion of the charge of the memory cell is combined with the second initial charge on the charge storage device, thereby producing a resulting charge on the status line and altering the second initial voltage on the charge storage device to produce a resulting voltage on the charge storage device;

comparing the resulting charge on the status line to the reference charge on the reference line thereby producing a comparison result;

if the resulting voltage on the charge storage device is greater than a threshold voltage, then providing a first additional charge from the third supply to the status line and memory cell thereby increasing the voltage on the charge storage device and the memory cell;

if the resulting voltage is less than the threshold voltage, then holding the voltage on the charge storage device and the memory cell; and transferring the charge to the memory cell thereby refreshing the logical state.

15. The method of operation according to claim 14 wherein the step of sharing a portion of the first initial charge further comprises setting a switch to couple the memory cell to the status line.

16. The method of operation according to claim 14 wherein the step of transferring the charge to the memory cell further includes the step of setting a switch to isolate the memory cell from the status line.

* * * * *

UNITED STATES PATENT AND TRADEMARK OFFICE
CERTIFICATE OF CORRECTION

PATENT NO.   : 6,801,467 B2
DATED        : October 5, 2004
INVENTOR(S)  : Richard Ferrant et al.

It is certified that error appears in the above-identified patent and that said Letters Patent is hereby corrected as shown below:

Column 8,
Line 1, "to e brought" should read as -- to be brought --.

Signed and Sealed this

Twenty-third Day of August, 2005

JON W. DUDAS
*Director of the United States Patent and Trademark Office*